United States Patent
Shi et al.

(10) Patent No.: US 7,674,642 B2
(45) Date of Patent: Mar. 9, 2010

(54) METHOD OF FABRICATING LINEAR CASCADE HIGH-SPEED GREEN LIGHT EMITTING DIODE

(75) Inventors: Jin-Wei Shi, Taipei (TW); Jinn-Kong Sheu, Jiangjyun Township, Tainan County (TW); Mao-Jen Wu, Pingjhen (TW); Chun-Kai Wang, Taipei (TW); Cheng-Hiong Chen, Taipei (TW); Jen-Inn Chyi, Pingjhen (TW)

(73) Assignee: National Central University, Jhongli, Taoyuan (TW)

( * ) Notice: Subject to any disclaimer, the term of this patent is extended or adjusted under 35 U.S.C. 154(b) by 200 days.

(21) Appl. No.: 11/984,335

(22) Filed: Nov. 16, 2007

(65) Prior Publication Data

US 2008/0274573 A1    Nov. 6, 2008

(30) Foreign Application Priority Data

May 3, 2007    (TW) .............................. 96115765 A (51) Int. Cl.
*H01L 21/00* (2006.01)

(52) U.S. Cl. .................... 438/34; 257/97; 257/E25.032
(58) Field of Classification Search .................... 438/34; 257/97, E25.032
See application file for complete search history.

(56) References Cited

U.S. PATENT DOCUMENTS

| 7,221,044 B2 * | 5/2007 | Fan et al. ..................... 257/676 |
| 2009/0206325 A1 * | 8/2009 | Biwa et al. ..................... 257/28 |

* cited by examiner

*Primary Examiner*—Ha Tran Nguyen
*Assistant Examiner*—Shaun Campbell
(74) *Attorney, Agent, or Firm*—Jackson IPG PLLC (57) ABSTRACT

Green light emitting diodes (LED) of gallium arsenide (GaAs) are series-connected. The series connection has a small transmission attenuation and a wide bandwidth. The GaAs LED has a big forward bias and so neither extra driving current nor complex resonant-cavity epitaxy layer is needed. Hence, the present invention has a high velocity, a high efficiency and a high power while an uneven current distribution is avoided.

17 Claims, 13 Drawing Sheets

METHOD OF FABRICATING LINEAR CASCADE HIGH-SPEED GREEN LIGHT EMITTING DIODE

FIELD OF THE INVENTION

The present invention relates to a green light emitting diode (LED); more particularly, relates to fabricating a series connection of green LEDs having a small transmitting attenuation and a wide bandwidth without extra driving current and complex resonant-cavity epitaxy layer to obtain a high velocity, a high efficiency and a high power while avoiding uneven current distribution.

DESCRIPTION OF THE RELATED ARTS

Plastic fiber is widely used in mother boards and mobile phones. A plastic fiber having a velocity up to 500 mega bits per second (Mbps) or even 1 giga bits per second (Gbps) can be applied in most of high-tech daily needs requiring glass fibers. Although a plastic fiber transmission module is generally limited to its transmission velocity and thus is mainly applied in audio transmission, video transmission is applicable to high definition television (HDTV), car-driving real-time video, digital camera transmission and home network using IEEE-1394 plastic fiber, etc. when the velocity is upgraded to 1 Gbps.

Figure 12:
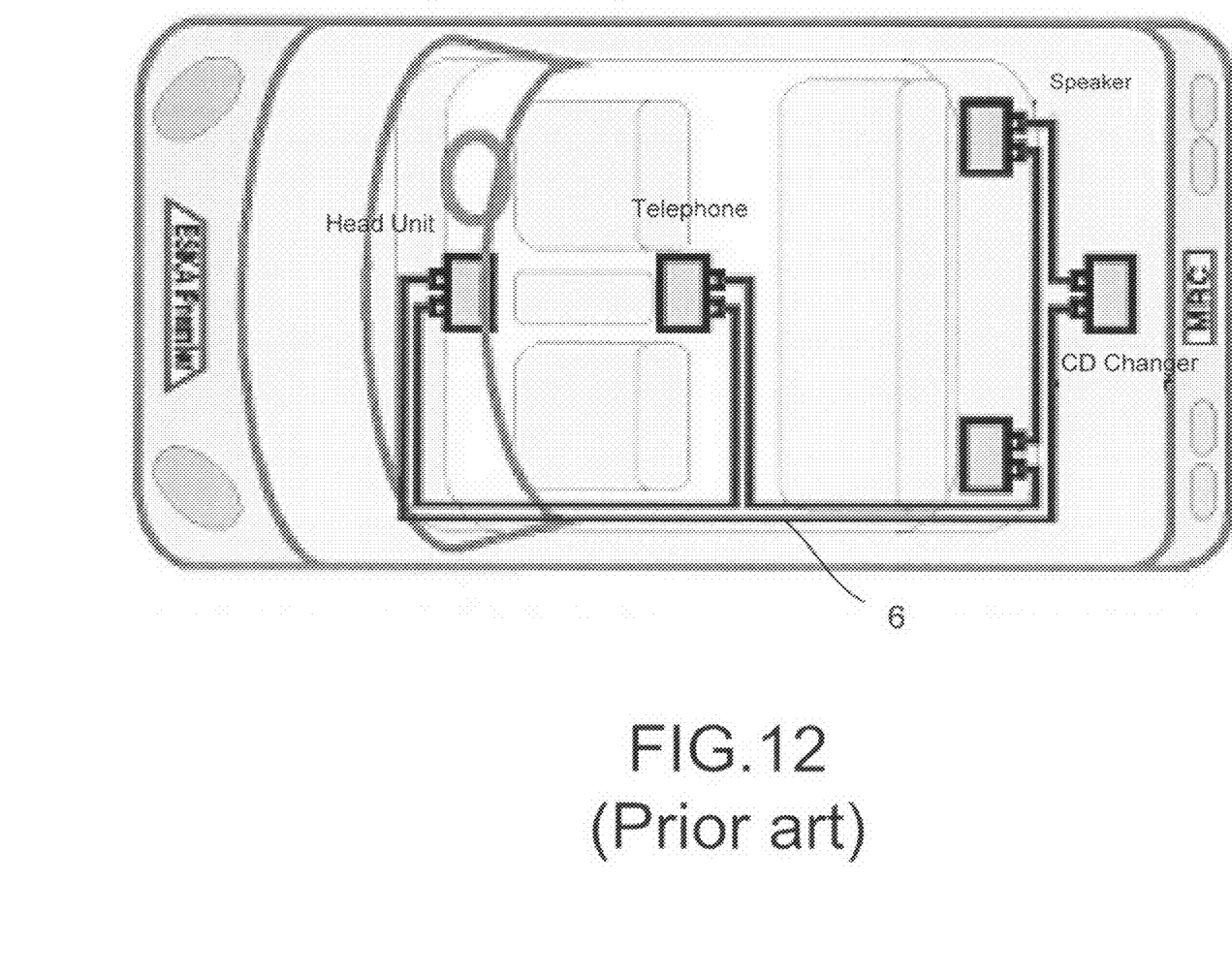
FIG. 12 is the view of the car network system.

As shown in FIG. 12, the plastic fiber is used in an in-car fiber transmission. Its specification includes a red LED of 22.5 Mbps having a low-attenuation window at 650 nanometers (nm); and a PMMA plastic fiber 6. However, low-attenuation windows of the PMME fiber are located at 520 nm and 570 nm. On comparing to the low-attenuation windows at 520 nm and 570 nm, the low-attenuation window at 650 nm for the red LED has a higher attenuation and a narrower bandwidth. As a result, after using the red LED for a long time, a heat thus obtained would shift the wavelength of the light source; and a power attenuation would become great owing to the operation at a bandwidth having a bigger attenuation.

Figure 13:
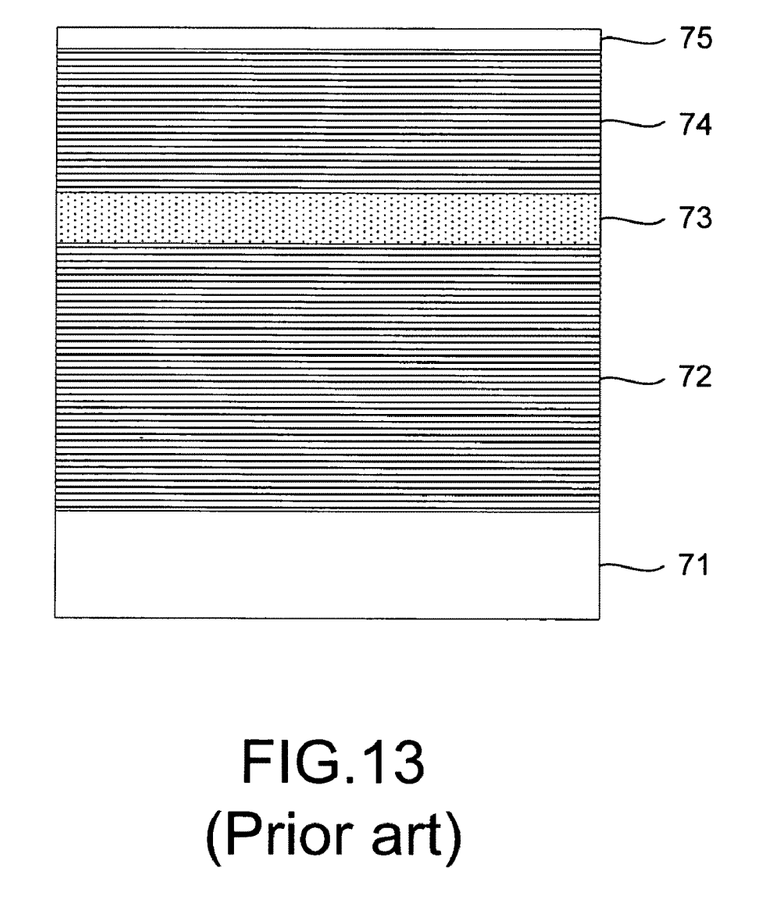
FIG. 13 is the view of the prior art.

Another prior art is shown in FIG. 13. A red LED having distributed reflectors comprises a gallium arsenide (GaAs) substrate 71, a plurality of distributed bottom mirrors 72, an activity limitation area 73, a top distributed Bragg reflector (DBR) mirror 74 and a contact layer 75, where a light-emitting efficiency and an output power are improved. And, not only the light-emitting efficiency and the output power are improved, but the coupling efficiency of an output light field to the fiber is also enhanced. However, a green-light wavelength is not obtained easily with the prior art because of a lattice mismatch of InGaN/GaN. Even if by broadening an active area of the green LED to improve its output power, the green LED still had a bad performance owing to RC bandwidth limit and current crowding effect.

Moreover, although a general series connection of LEDs has the same improved efficiency as a LED having a resonant-cavity, a divergence angle of light field of the series connection is still as big as that of a general LED, and thus results in a bad coupling efficiency to fiber.

Hence, the red or green LED having fiber used in an in-car communication system requires a complex epitaxy layer of resonant cavity with a big attenuation in light power; and, the coupling of the light source to the fiber are bad owing to a conflict between velocity and power. Nevertheless, current distribution is thus uneven. Hence, the prior arts do not fulfill all users' requests on actual use.

SUMMARY OF THE INVENTION

The main purpose of the present invention is to fabricate a series connection of green LEDs having a small transmitting attenuation and a wide bandwidth without extra driving current and complex resonant-cavity epitaxy layer to obtain a high velocity, a high efficiency and a high power while avoiding uneven current distribution.

To achieve the above purpose, the present invention is a method of fabricating a linear cascade high-speed green LED, comprising steps of: (a) obtaining a substrate; (b) growing a green-light multi-wavelength quantum well on the substrate to form a pn diode structure with the green-light multi-wavelength quantum well surrounded by a p-type doped area and an n-type doped area at a side and on an upper and an lower surfaces; (c) connecting the p-type doped area of each diode structure to the n-type doped area of an adjacent diode structure to form a series connection of the diode structures and thus to avoid current crowding effect, where the series connection of the diode structures is obtained through further deposing a positive electrode and a negative electrode of a coplanar waveguide electrode plate on an insulation layer above the p-type doped area and the n-type doped area for accessing outside signals; and, on a surface of the series connection of the diode structures, a film or multiple films of a dielectric are added or etched to adjust an output light field and to further form a LED having a cyclic mini-structure. Accordingly, a novel method of fabricating a linear cascade high-speed green LED is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
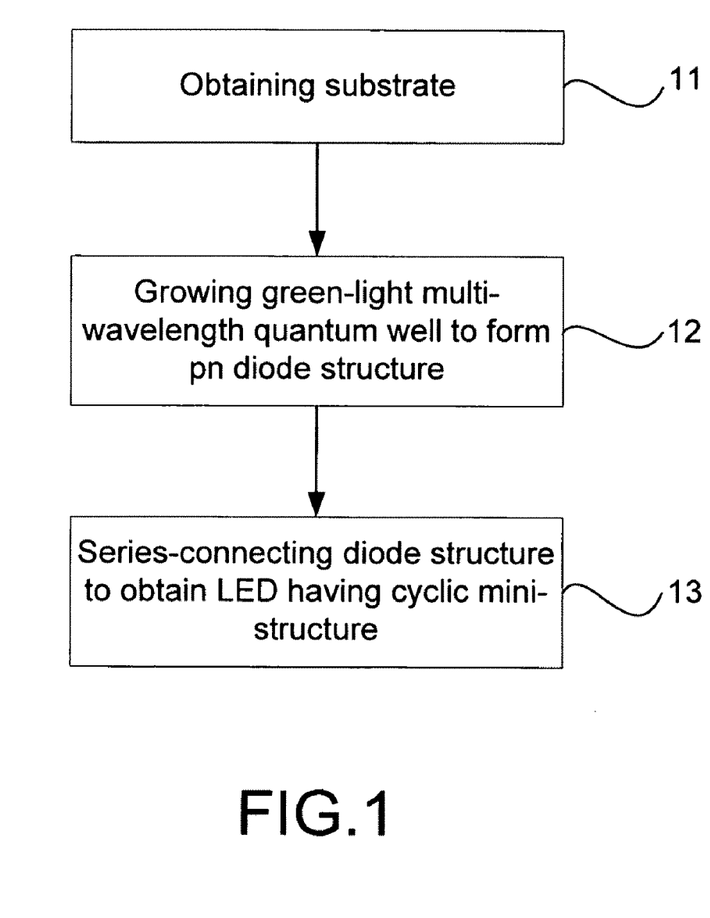
FIG. 1 is the flow view showing the preferred embodiment according to the present invention.
Figure 2:
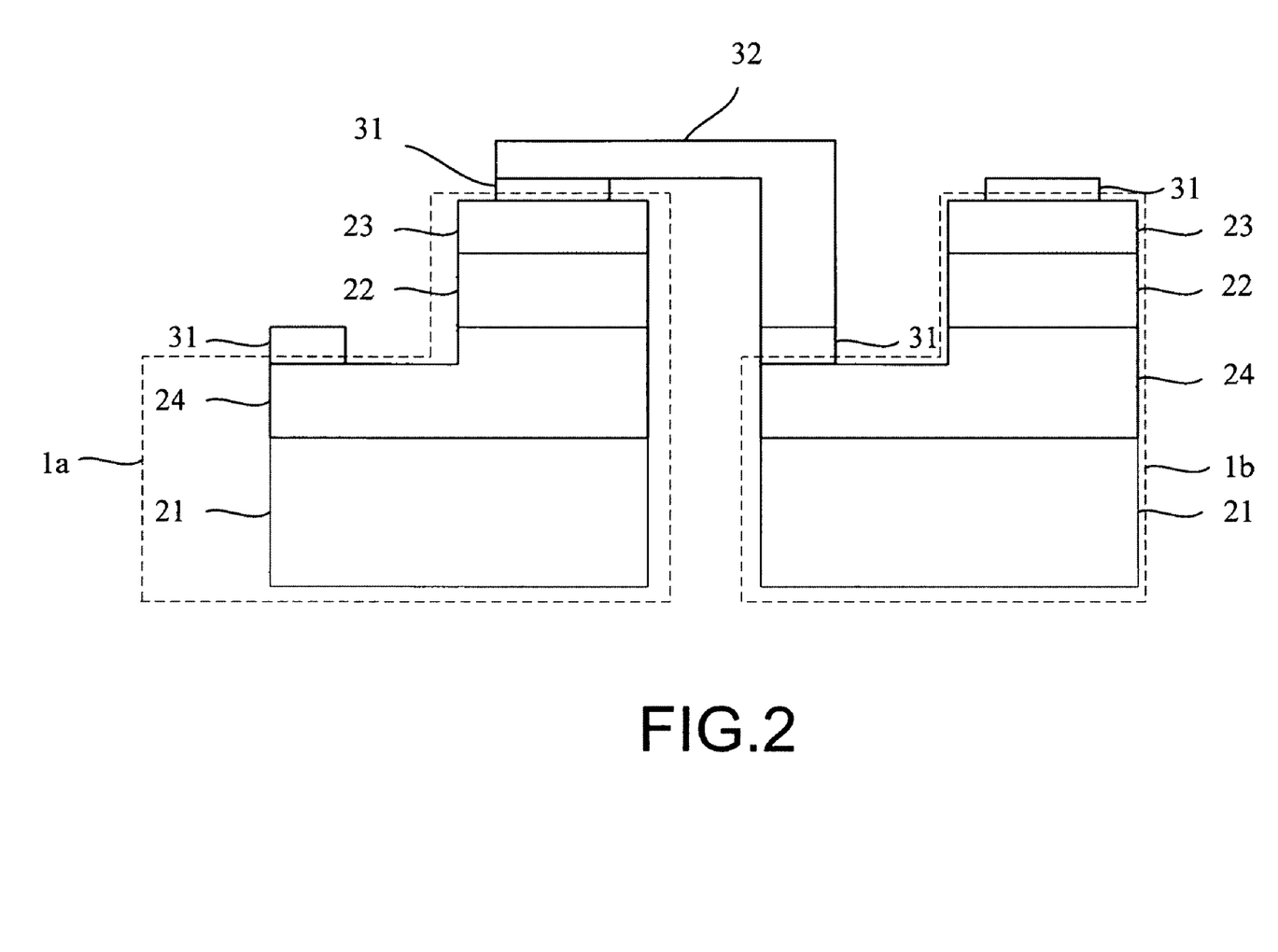
FIG. 2 is the view showing the first series connection of the present invention.
Figure 3:
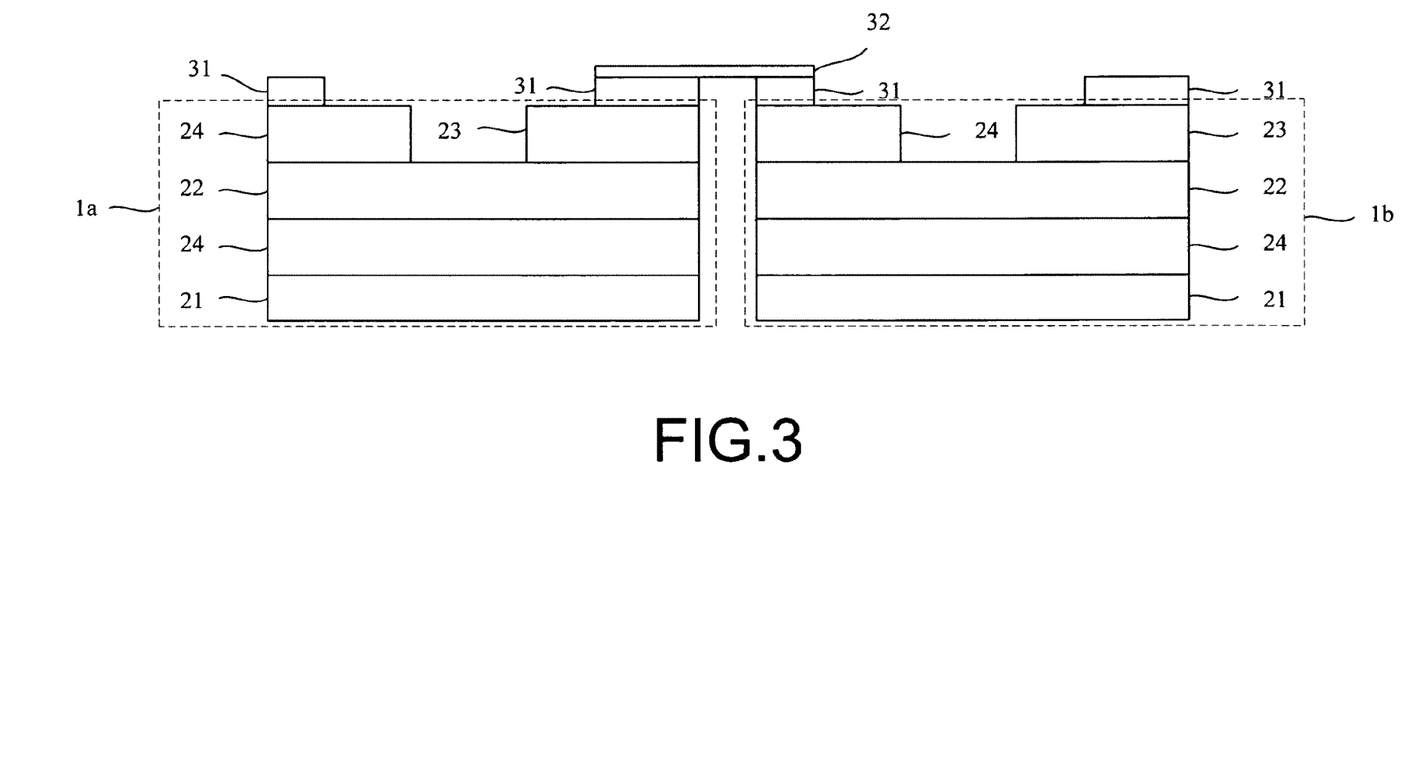
FIG. 3 is the view showing the second series connection of the present invention.
Figure 4:
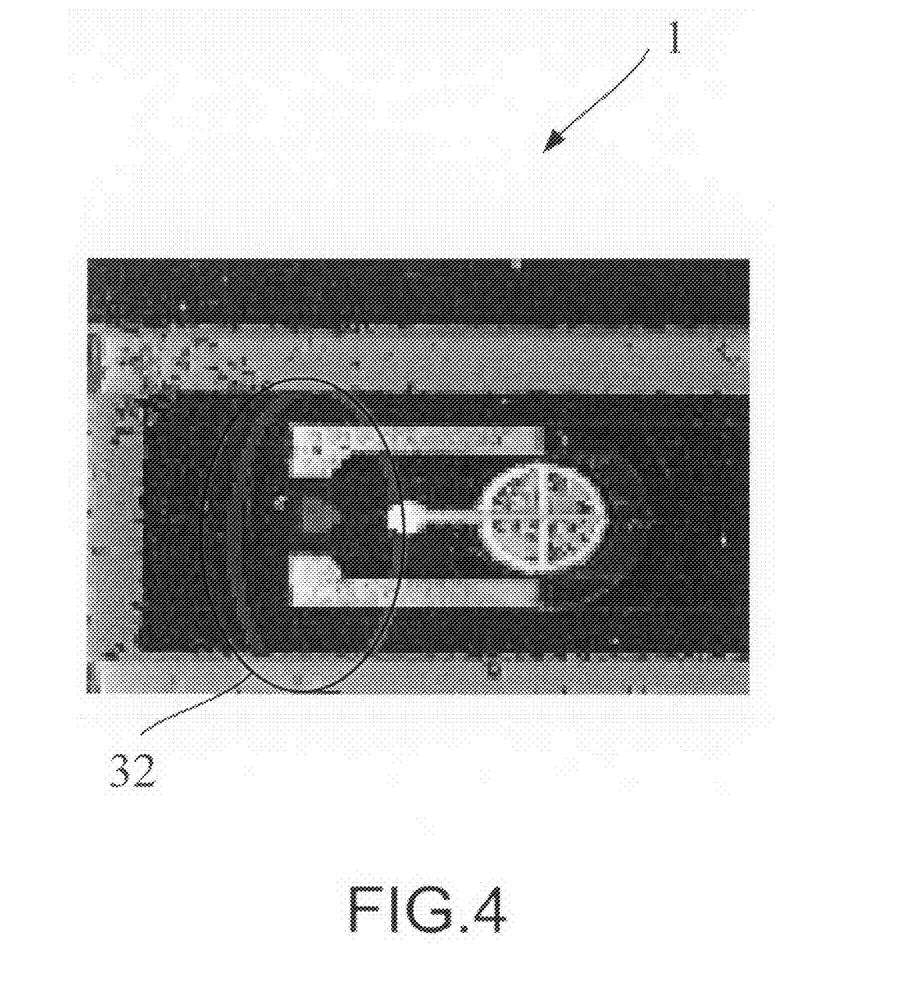
FIG. 4 is the top-down view showing the LED.
Figure 5:
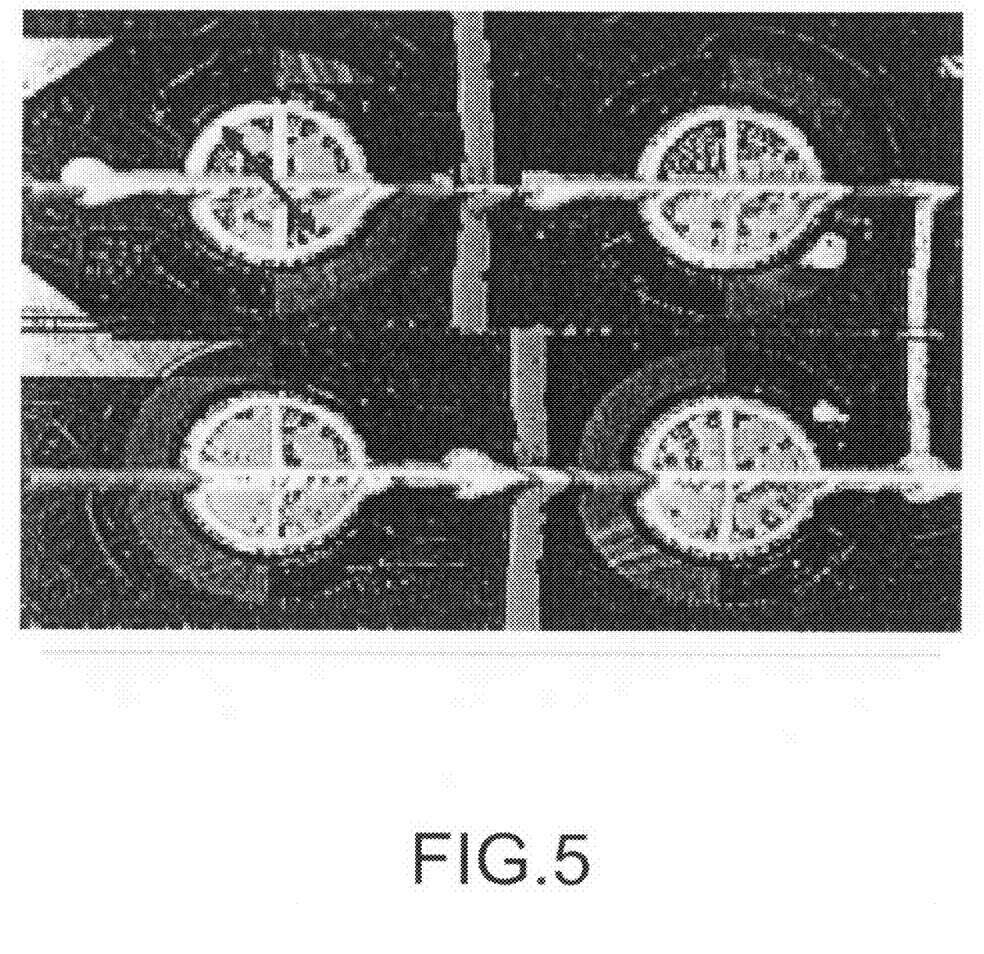
FIG. 5 is the view showing the series connection of the LEDs.
Figure 6:
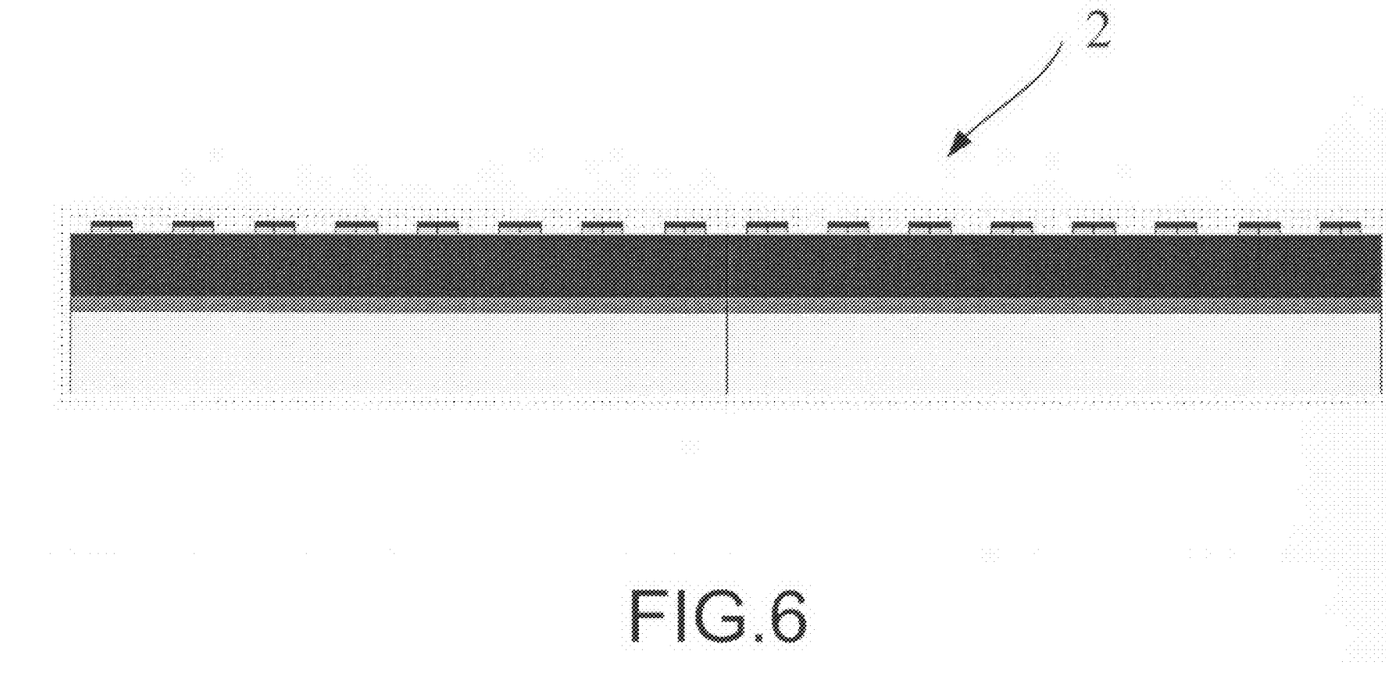
FIG. 6 is the view showing the cyclic mini-structure of the present invention.

Please refer to FIG. 1 to FIG. 6, which are a flow view showing a preferred embodiment according to the present invention; views showing a first and a second series connections of the present invention; a top-down view showing the LED; and views showing as series connection of the LEDs and the cyclic mini-structure of the present invention. As shown in the figures, the present invention is a method of fabricating a linear cascade high-speed green light emitting diode (LED), comprising the following steps:

(a) Obtaining substrate 11: A substrate 21 made of a semi-insulating semiconductor or an insulating dielectric material is obtained, where the semi-insulating semiconductor is a IV group compound of gallium arsenide (GaAs), indium phosphide (InP), aluminum nitride (AlN), indium nitride (InN) or silicon (Si); and the insulating dielectric material is sapphire, silicon carbide (SiC) or diamond.

(b) Growing green-light multi-wavelength quantum well to form pn diode structure 12: A green-light multi-wavelength quantum well 22 is grown on the substrate 21, where the green-light multi-wavelength quantum well 22 is surrounded by a p-type doped are a 23 and an n-type doped area 24 at a side and on an upper and an lower surfaces to form a pn diode structure 1. The p-type doped area 23 and the n-type doped area 24 surrounding the green-light multi-wavelength quantum well 22 is obtained through one of the following methods:

(i) A flat plate is obtained through etching the green-light multi-wavelength quantum well 22. Then the p-type doped area 23 and the n-type doped area 24 are obtained through epitaxy at a side to form the pn diode structure 1.

(ii) P-type and n-type doping materials for semiconductors are implanted at a side of the green-light multi-wavelength quantum well 22 through ion implantation. Therein, the p-type doped area 23 and the n-type doped area 24 are expanded to a required depth and area through heating. During the heating, a light emitting area is covered by a covering material. And the uncovered area obtains a reduced resistance through a quantum well disorder after the ion implantation to form the pn diode structure 1. Therein, the green-light multi-wavelength quantum well 22 is formed by a heterojunction of various semiconductors and alloys of the semi conductors; the green-light multi-wavelength quantum well 22 is GaN/AlGaN/InGaN; the covering material is silicon nitride ($Si_3N_4$); and the epitaxy is molecular beam epitaxy (MBE), metal organic chemical vapor deposition (MOCVD) or hydride vapor phase epitaxy (HVPE).

(c) Series-connecting diode structure to obtain LED having cyclic mini-structure 13: The p-type doped area 23 of each diode structure 1a is connected to the n-type doped area 24 of an adjacent diode structure 1b to form a series connection of the diode structures and thus to avoid current crowding effect. Therein, the series connection of the diode structures is obtained through further depositing a positive electrode and a negative electrode of a coplanar waveguide electrode plate 32 on an insulation layer 31 above the p-type doped area 23 and the n-type doped area 24 for accessing outside signals. Furthermore, on a surface of the series connection of the diode structures, a film or multiple films of a dielectric is added or etched to adjust an output light field and to further form a LED having a cyclic mini-structure 2 for reducing a divergence angle and improving a light-field coupling efficiency. Therein, the dielectric is made of silicon nitride ($SiN_x$), silicon oxide ($SiO_x$), $Si_3N_4$, silicon dioxide ($SiO_2$) or calcium fluoride ($CaF_2$).

Thus, a novel method of fabricating a linear cascade high-speed green LED is obtained.

Figure 7:
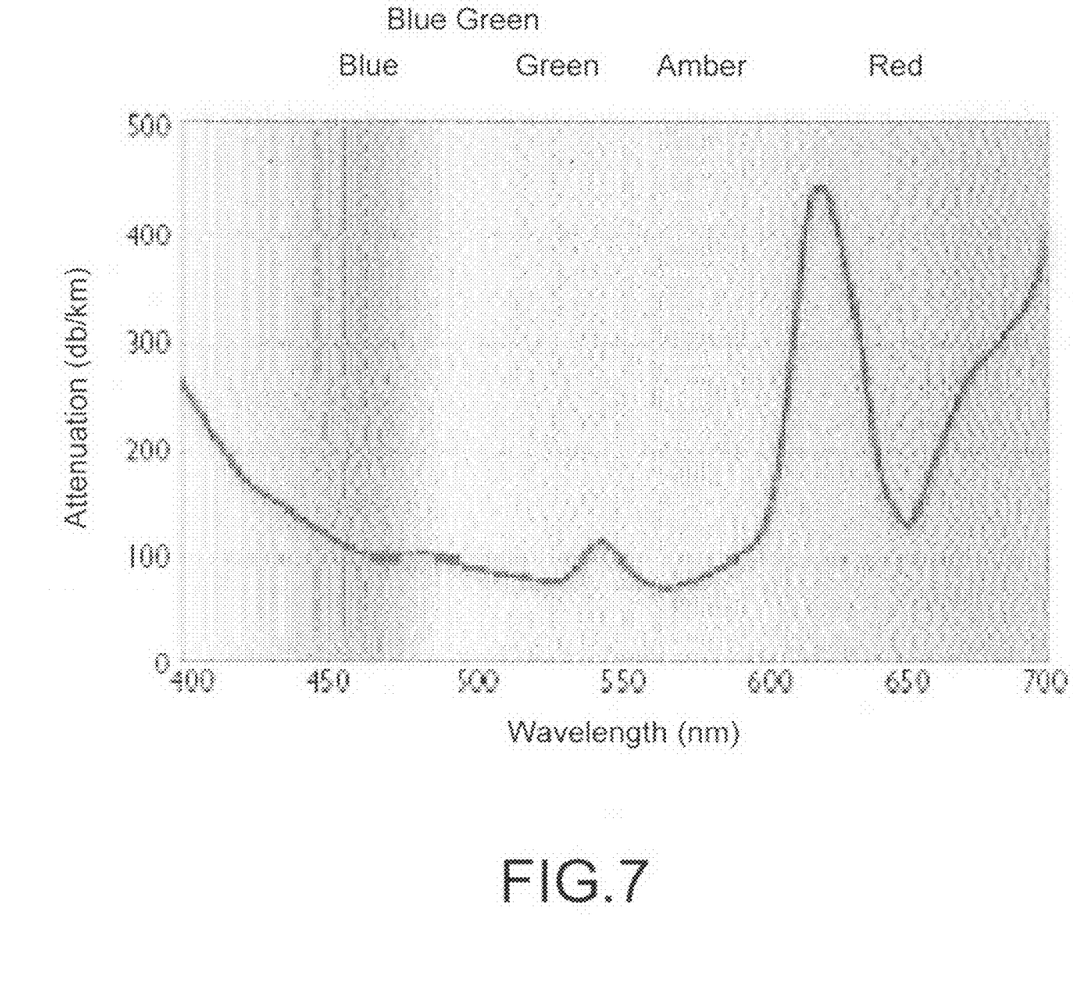
FIG. 7 is the view showing the wavelength curve for PMMA.

Please further refer to FIG. 7, which is a view showing a wavelength curve for polymethylmethacrylate (PMMA). As shown in the figure, wider low-attenuation windows of PMMA are appeared at wavelengths of 520 nanometers (nm) and 570 nm, where the PMMA has a shifted center wavelength of green light. Since the PMMA plastic fiber has a small broadcasting attenuation and a wide bandwidth, the PMMA is used in the present invention for a communicative green LED in car.

Figure 8:
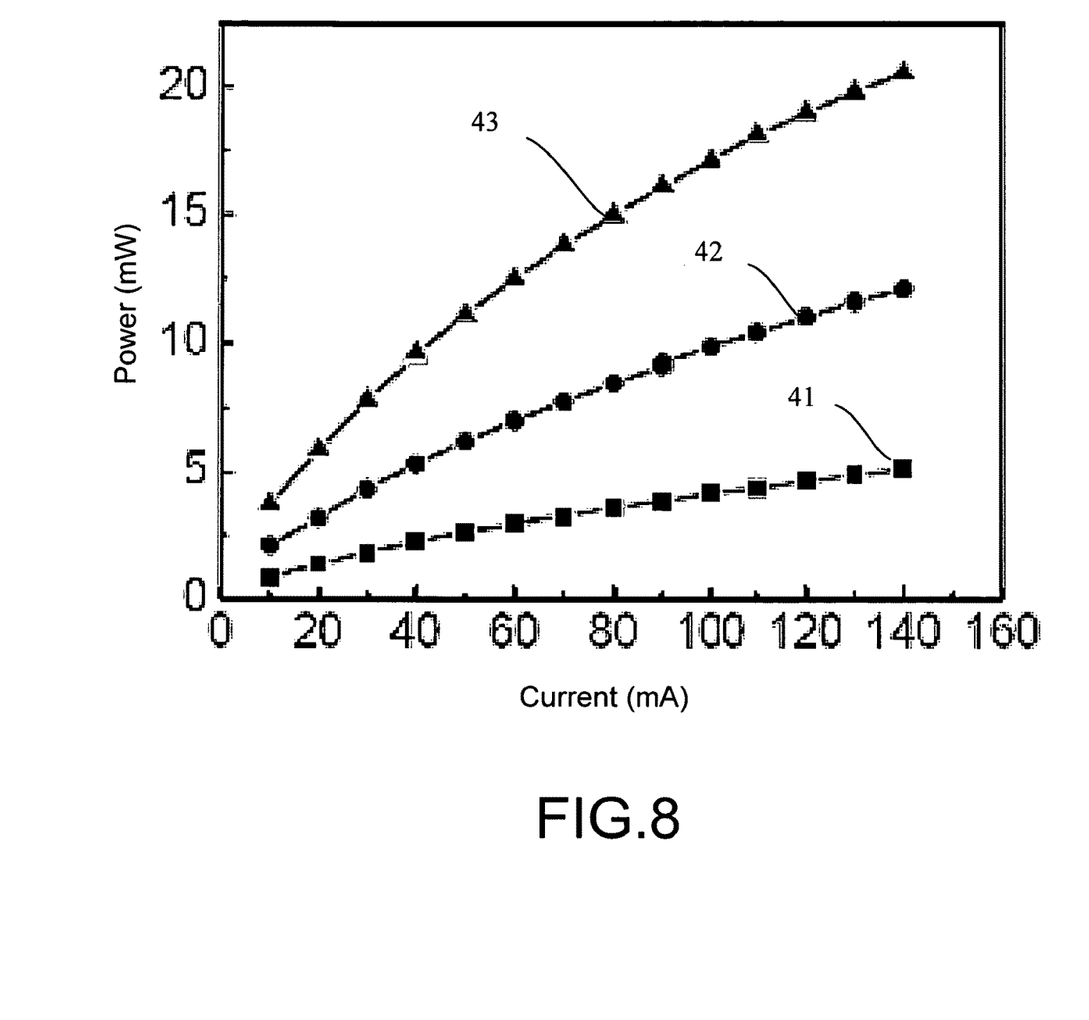
FIG. 8 is the view showing the ratio curves of current to power for the single LED and the series-connected LEDs.
Figure 9:
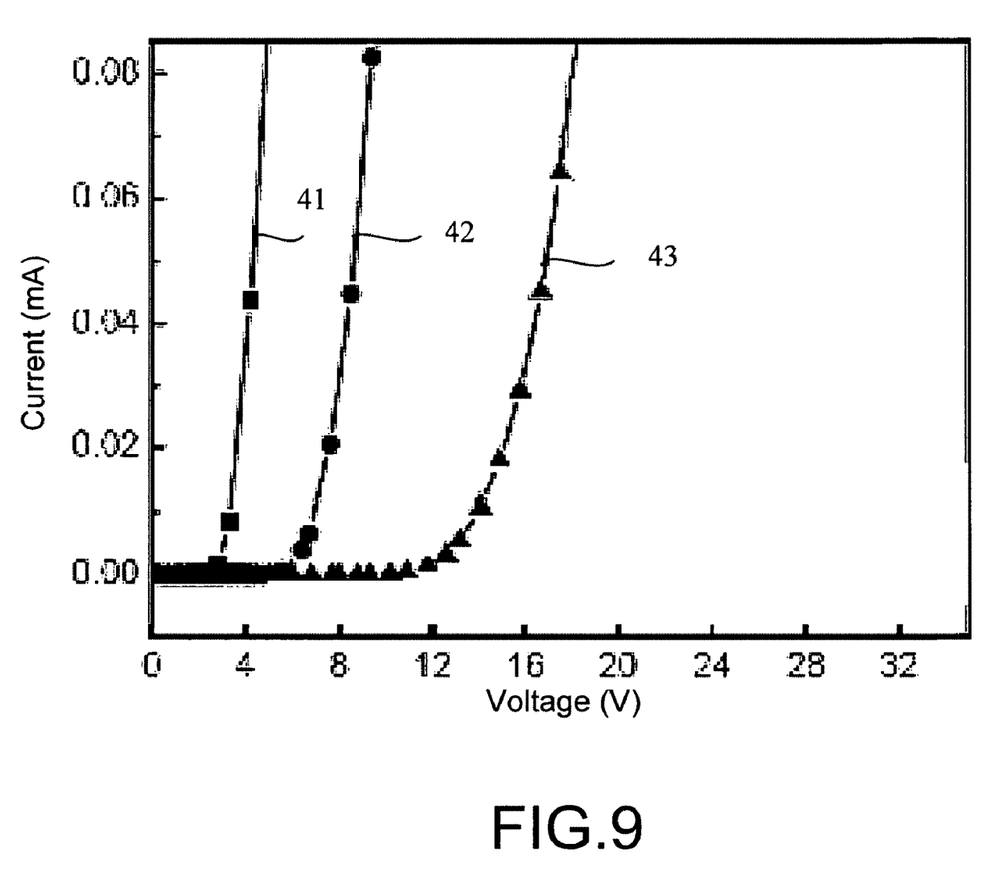
FIG. 9 is the view showing the ratio curves of voltage to current for the single LED and the series-connected LEDs.

Please refer to FIG. 8 and FIG. 9, which are views showing ratio curves of current to power and ratio curves of voltage to current for a single LED and series-connected LEDs. As shown in the figures, a series connection of LEDs according to the present invention improves an external quantum efficiency, which has a direct ratio to a number of LEDs. A curve of a single green LED 41, a curve of a double green LED 42 and a curve of a quatre green LED 43 show two to four times of improvement of output efficiency, which also shows small current crowding effect. As a comparison to a parallel connection, the present invention does not improve in wall-plug efficiency owing to an improvement in turn-on voltage; but, as the turn-on voltage has a linear improvement according to the number of LEDs, an in-car battery is directly driven without extra design and thus a cost is saved. For example, a GaAs green LED according to the present invention has a voltage of 10 volts (V) with a big forward bias, and thus a series connection of three GaAs green LEDs directly drives a 12V in-car battery without extra design.

Figure 10:
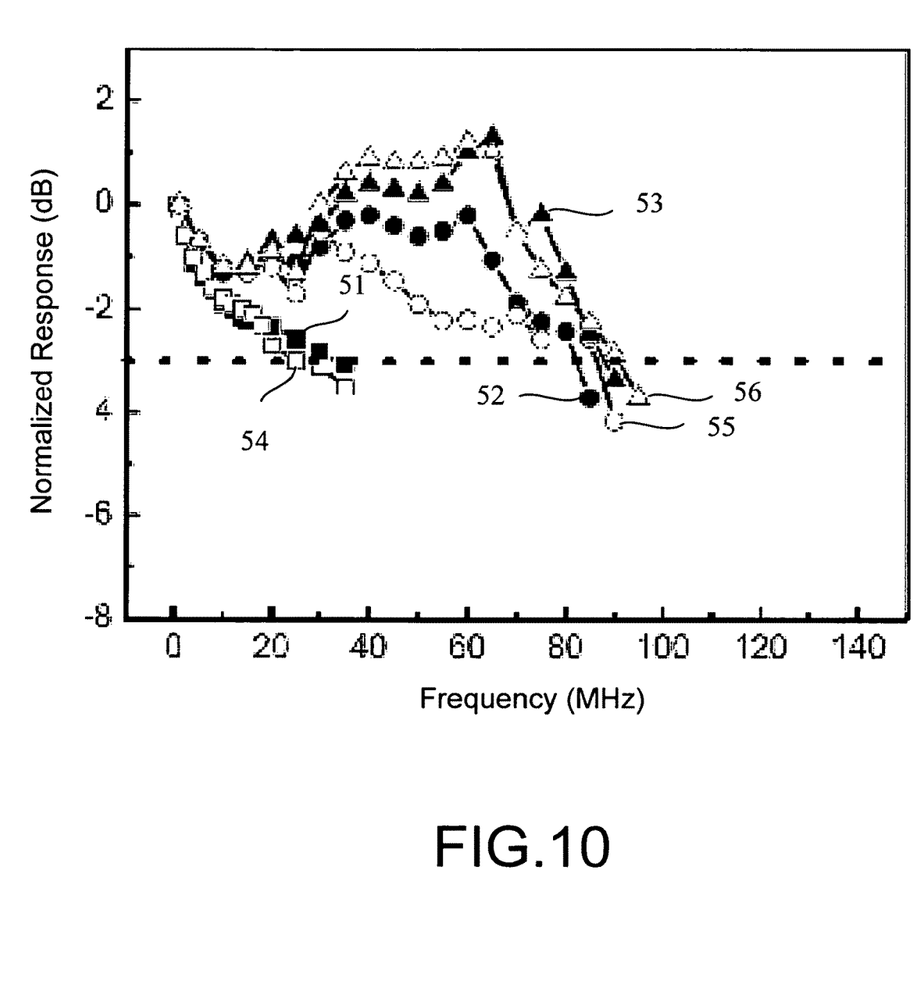
FIG. 10 is the view showing the ratio curves of frequency to response for the single LED and the series-connected LEDs.

Please refer to FIG. 10, which is a view showing ratio curves of frequency to response for a single LED and series-connected LEDs. As shown in the figure, although a series connection according to the present invention has a high output efficiency and power, a velocity of the series connection does not reduce after an increase in resistance because the series connection has a decreased capacitance according to a number of LEDs of the present invention. However, although the resistance is increased, a total resist is not increased owing to 50Ω radio frequency included. Hence, RC bandwidth limit does not become worse because of an increase in a total active area.

According to velocities for various currents as shown in a 60-milliampere (mA) curve 51, a 120 mA curve 52 and a 140 mA curve 53 of a single LED and a 60 mA curve 54, a 120 mA curve 55 and a 140 mA curve 56 of a qradre four LED, the qradre LED does not sacrifice in velocity owing to a bigger area, output efficiency and power. Hence, the present invention has a better performance in output power to velocity than traditional red LED.

Figure 11:
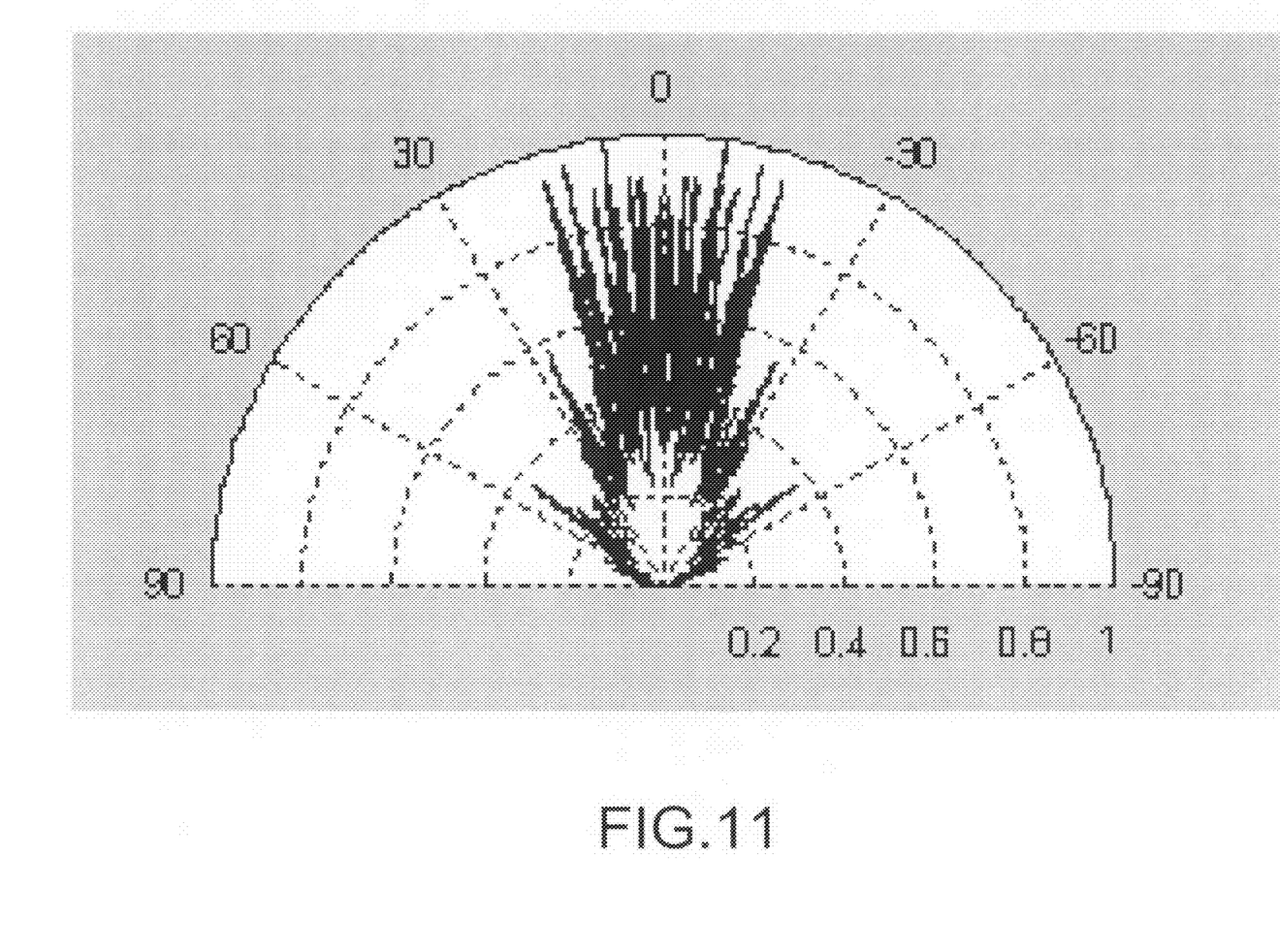
FIG. 11 is the view showing the output light field of the cyclic mini-structure.

Please refer to FIG. 11, which is a view showing an output light field of a cyclic mini-structure. As shown in the figure, a cyclic mini-structure 2 is obtained and an output light field has an opening angle reduced to ±30 degrees. In this way, a coupling efficiency of a light source to a fiber is effectively improved without growing a complex resonant-cavity epitaxy layer. And, thus, a green LED having a high velocity, a high efficiency and a high power is obtained while avoiding uneven current distribution.

To sum up, the present invention is a method of fabricating a linear cascade high-speed green LED, where a series connection of green LEDs has a small transmitting attenuation and a wide bandwidth with out extra driving current and complex resonant-cavity epitaxy layer; and thus the series connection of green LEDs has a high velocity, a high efficiency and a high power while avoiding uneven current distribution.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A method of fabricating a linear cascade high-speed green light emitting diode (LED), comprising the steps of:
   (a) obtaining a substrate;
   (b) growing a green-light multi-wavelength quantum well, a p-type doped area, and an n-type doped area on said substrate, wherein the quantum well is surrounded on an upper surface of the quantum well by the p-type doped area and the n-type doped area to obtain a diode structure; and
   (c) obtaining a series connection of a plurality of said diode structures by connecting said p-type doped area of one of said diode structures to said n-type doped area of an adjacent one of the diode structures.

2. The method according to claim 1,
   wherein said substrate is made of a material selected from a group consisting of a semi-insulating semiconductor and an insulating dielectric material.

3. The method according to claim 2,
   wherein said semi-insulating semiconductor is a IV group semiconductor; and
   wherein said IV group semiconductor is selected from a group consisting of gallium arsenide (GaAs), indium phosphide (InP), aluminum nitride (AlN), indium nitride (InN) and silicon (Si).

4. The method according to claim 2,
   wherein said insulating dielectric material is selected from a group consisting of sapphire, silicon carbide (SiC) and diamond.

5. The method according to claim 1,
   wherein said green-light multi-wavelength quantum well is obtained by a heterojunction of various semiconductors and alloys of said semiconductors; and
   wherein said green-light multi-wavelength quantum well is GaN/AlGaN/InGaN.

6. The method according to claim 1,
   wherein said green-light multi-wavelength quantum well is etched to obtain a flat plate and wherein said p-type doped area and said n-type doped area are obtained at sides of said green-light multi-wavelength quantum well through epitaxy.

7. The method according to claim 6,
   wherein said epitaxy is selected from a group consisting of molecular beam epitaxy (MBE), metal organic chemical vapor deposition (MOCVD) and hydride vapor phase epitaxy (HVPE).

8. The method according to claim 1,
   wherein said p-type doped area and said n-type doped area obtained through ion implantation with a p-type doping material and an n-type doping material correspondingly at sides of said green-light multi-wavelength quantum well.

9. The method according to claim 8,
   wherein said ion implantation expands said p-type doped area and said n-type doped area through heating to obtain a required depth and area.

10. The method according to claim 9,
    wherein a light emitting area is covered by a covering material during said ion implantation.

11. The method according to claim 10,
    wherein said covering material is silicon nitride (Si3N4).

12. The method according to claim 1,
    wherein the upper surface and a lower surface of said green-light multi-wavelength quantum well are surrounded by said p-type doped area and said n-type doped area through epitaxy.

13. The method according to claim 12,
    wherein said epitaxy is selected from a group consisting of MBE, MOCVD and HVPE.

14. The method according to claim 1,
    wherein said series connection of said diode structures is obtained through further depositing a positive electrode and a negative electrode of a coplanar waveguide electrode plate on an insulation layer above said p-type doped area and said n-type doped area.

15. The method according to claim 1,
    wherein a single film or multiple films of a dielectric are further added on a surface of said linear cascade high-speed green LED after obtaining said series connection of said diode structure to obtain a LED having a cyclic mini-structure.

16. The method according to claim 15,
    wherein said dielectric is made of a material selected from a group consisting of silicon nitride (SiNx), silicon oxide (SiOx), Si3N4, silicon dioxide (SiO2) and calcium fluoride (CaF2).

17. The method according to claim 15,
    wherein said cyclic mini-structure is obtained on said surface of said linear cascade high-speed green LED through direct etching of the single film or multiple films of dielectric after obtaining said series connection of said diode structure.

* * * * *